United States Patent
Kim et al.

(10) Patent No.: US 10,164,815 B2
(45) Date of Patent: Dec. 25, 2018

(54) EXTREMELY PRECISE FREQUENCY ESTIMATION APPARATUS AND METHOD FOR SINGLE RECEIVER

(71) Applicant: AGENCY FOR DEFENSE DEVELOPMENT, Daejeon (KR)

(72) Inventors: So-Yeon Kim, Daejeon (KR); Kyu-Ha Song, Daejeon (KR); San-Hae Kim, Daejeon (KR); Hyun-Gyu Kwak, Daejeon (KR); Chung-Su Jang, Sejong-si (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 0 days.

(21) Appl. No.: 15/827,259

(22) Filed: Nov. 30, 2017

(65) Prior Publication Data
US 2018/0234280 A1  Aug. 16, 2018

(30) Foreign Application Priority Data
Feb. 14, 2017 (KR) .......... 10-2017-0020147

(51) Int. Cl.
*H03G 5/02* (2006.01)
*H04B 10/61* (2013.01)
*H04L 27/00* (2006.01)
*H04L 27/26* (2006.01)

(52) U.S. Cl.
CPC ......... *H04L 27/2659* (2013.01); *H03G 5/025* (2013.01); *H04B 10/6164* (2013.01); *H04L 27/266* (2013.01); *H04L 2027/0067* (2013.01)

(58) Field of Classification Search
USPC ....................................... 375/260
See application file for complete search history.

(56) References Cited

U.S. PATENT DOCUMENTS

| 6,373,861 B1 * | 4/2002 | Lee .......... H04L 5/026 370/342 |
| 2015/0109053 A1 * | 4/2015 | Sahinoglu .......... H03D 5/00 329/327 |

FOREIGN PATENT DOCUMENTS

KR  10-0817692 B1  3/2008

* cited by examiner

*Primary Examiner* — Wednel Cadeau
(74) *Attorney, Agent, or Firm* — LRK Patent Law Firm

(57) ABSTRACT

A frequency estimation apparatus and method for a single receiver. The frequency estimation apparatus for the single receiver includes: a coarse frequency estimation unit estimating a coarse frequency by calculating an average of frequency estimation values for each single pulse; a direct current domain transformation unit transforming a reception signal into a direct current domain based on the coarse frequency; a fine frequency estimation unit estimating a fine frequency by applying regression analysis to a pulse train in the direct current domain of the coarse frequency; and an extremely fine frequency estimation unit estimating an extremely fine frequency by compensating an error of the coarse frequency with the fine frequency.

11 Claims, 6 Drawing Sheets

EXTREMELY PRECISE FREQUENCY ESTIMATION APPARATUS AND METHOD FOR SINGLE RECEIVER

CROSS REFERENCE TO RELATED APPLICATION(S)

This application claims the benefit of Korean Patent Application No. 10-2017-0020147, filed 14 Feb. 2017, which is hereby incorporated by reference in its entirety into this application.

BACKGROUND OF THE INVENTION

1. Technical Field

The present invention relates generally to an extremely precise frequency estimation apparatus and method for a single receiver. More particularly, the present invention relates to an extremely precise frequency estimation apparatus and method for a single receiver, the apparatus and method being capable of estimating an extremely fine frequency by compensating an error of a coarse frequency, which is an average of frequency estimation values, derived by applying regression analysis to each single pulse, with a fine frequency estimated by applying regression analysis to a pulse train in a direct current domain, thereby estimating a frequency of an input signal source.

2. Description of the Related Art

Frequency is the most important information of a signal, and a basic unit of signal processing. Therefore, an electronic signal processing apparatus including a measurement apparatus requires a process of analyzing an input signal by measuring and estimating a fine frequency of the input signal.

As a general frequency measurement method, there is a Fourier transform method, wherein a signal is transformed from a time domain into a frequency domain. Accordingly, a Fourier transform method is where Fourier transform is performed on a signal, and next, the largest value in a frequency domain, namely, the peak is estimated as a frequency of the signal.

FIGS. 1A and 1B are views showing Fourier transform of a pulse-type signal. In a case of the pulse-type signal, when a pulse width (PW) is relatively smaller than a pulse repetition interval (PRI), an envelope for predicting a frequency estimated by using Fourier transform is gradual. Therefore, predicting the peak of the frequency is imprecise. That is, in this case, frequency estimation accuracy is low. FIG. 1A shows Fourier transform result at PRI=100 µs, PW=10 µs, and FIG. 1B shows Fourier transform result at PRI=100 µs, PW=1 µs. As shown in FIGS. 1A and 1B, the Fourier transform results show that when the pulse width (PW) is small, peak estimation is imprecise and thus frequency estimation accuracy is low.

In addition, when a sampling speed is the same, frequency resolution and a processing speed is highly dependent on a window size (N-point Fourier transform) for Fourier transform. Generally, when a window size of Fourier transform is large, frequency resolution is high, but calculating speed increases.

Next, as a frequency measurement method, there is a method of estimating a frequency by measuring phase shift.

Here, a phase means an angle of a complex signal, and a signal having a frequency has a phase in a range of −p to p values. For example, in a case of a frequency equal to greater than 1 Hz, a periodic phase from −p value to p value is continuously repeated. When indicating such signal in the time(x)-phase(y) coordinates system, a continuous wave is indicated in a wrapped form as shown in FIG. 2. FIG. 2 is a view showing a measurement phase of a reception signal according to an acquisition time.

Consequently, a frequency may be estimated by measuring phase shift. The frequency is estimated by unwrapping a signal of FIG. 2 as shown in FIG. 3, and by measuring an inclination (shift: change) of a phase in the time(x)-phase(y) coordinates system. Here, unwrapping means that phase values are accumulated by continuously adding phase values that occur after the first p value, to previous phase values. FIG. 3 is a view showing the result of unwrapping a reception signal of FIG. 2.

Accordingly, a method of estimating a frequency by using phase shift is estimation of inclination change of a phase. Such method is a method of estimating inclination of a data variable in the given coordinates system. An inclination estimation method of a data variable may use regression analysis or Taylor series, etc.

As described above, the method of estimating a frequency by using phase shift is faster and simpler than the method of estimating a frequency by using Fourier transform. However, as shown in FIG. 4, in a case of a pulse-type signal not a continuous wave, when unwrapping is performed, an error may occur during accumulating phase values. Therefore, the method using phase shift to estimate a frequency may have problems. FIG. 4 is a view showing a comparison between unwrapping results of a continuous wave signal and a pulse signal. For this reason, the method of estimating a frequency by using phase shift is usually for a single pulse, and thus frequency estimation accuracy has RMS error of scores Hz to several kHz.

Therefore, in a single receiver, there is a need for a frequency estimation method that can analyze and process a frequency of a signal with high accuracy.

In the meantime, a conventional technology related to phase estimation using Fourier transform is disclosed in 'a method for estimating phase of time series data by discrete Fourier transform' of Korean Patent No. 10-0817692.

DOCUMENT OF RELATED ART (Patent Document 1) Korean Patent No. 10-0817692 (21 Mar. 2008)

SUMMARY OF THE INVENTION

Accordingly, the present invention has been made keeping in mind the above problems occurring in the related art, and an object of the present invention is to provide an extremely precise frequency estimation apparatus and method for a single receiver, the apparatus and method estimating an extremely fine frequency by compensating an error of a coarse frequency, which is an average of frequency estimation values, derived by applying regression analysis to each single pulse, with a fine frequency estimated by applying regression analysis to a pulse train in a direct current domain, thereby estimating a frequency of an input signal source.

In order to accomplish the above object, the present invention provides an extremely precise frequency estimation apparatus for a single receiver, the apparatus including: a coarse frequency estimation unit estimating a coarse frequency by calculating an average of frequency estimation values for each single pulse; a direct current domain transformation unit transforming a reception signal into a direct current domain based on the coarse frequency; a fine frequency estimation unit estimating a fine frequency by applying regression analysis to a pulse train in the direct current domain of the coarse frequency; and an extremely fine frequency estimation unit estimating an extremely fine frequency by compensating an error of the coarse frequency with the fine frequency.

The frequency estimation value of each single pulse may be an inclination in linear regression analysis where vectors indicating a phase shift value and an acquisition time of the pulse are used.

The fine frequency may be an inclination in linear regression analysis where vectors indicating a phase shift value and an acquisition time of the pulse train are used.

The inclination may be a frequency value indicated as an angle.

A frequency error between the coarse frequency and the reception signal may have a negative or positive correlation with an inclination of a pulse train signal transformed into the direct current domain based on the coarse frequency.

The extremely fine frequency estimation unit may estimate the extremely fine frequency by adding the coarse frequency and the fine frequency.

In the meantime, according to another aspect, there is provided an extremely precise frequency estimation method for a single receiver, the method including: estimating a coarse frequency by calculating an average of frequency estimation values for each single pulse; transforming a reception signal into a direct current domain based on the coarse frequency; estimating a fine frequency by applying regression analysis to a pulse train in the direct current domain of the coarse frequency; and estimating an extremely fine frequency by compensating an error of the coarse frequency with the fine frequency.

The present invention can estimate an extremely fine frequency by compensating an error of a coarse frequency, which is an average of frequency estimation values, derived by applying regression analysis to each single pulse, with a fine frequency estimated by applying regression analysis to a pulse train in a direct current domain, thereby precisely estimating a frequency of an input signal source.

In addition, the present invention can provide an extremely fine frequency estimation technique that reduces RMS error of scores Hz to several kHz, which occur at conventional frequency estimation techniques, to precisely estimate a frequency of a signal source in the single receiver, whereby it is possible to analyze and process the frequency.

In addition, the present invention provides a process that is faster and simpler than Fourier transform, whereby the present invention requires an input value only for a section where a signal exists, and thus computation and memory requirements are reduced, which is different from Fourier transform requiring an input value as an input variable for a section where a signal does not exist.

In addition, the present invention can be applied in several civil-military industry fields where high-level frequency precision estimation and measurement are required, by enhancing frequency estimation accuracy in a single receiver.

In addition, the present invention can be used in frequency difference of arrival (FDOA) location estimation fields, signal analysis and identification fields using frequency data information, and frequency measurement accuracy improvement fields of a measuring instrument, etc. where extremely fine frequency measurement is required.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
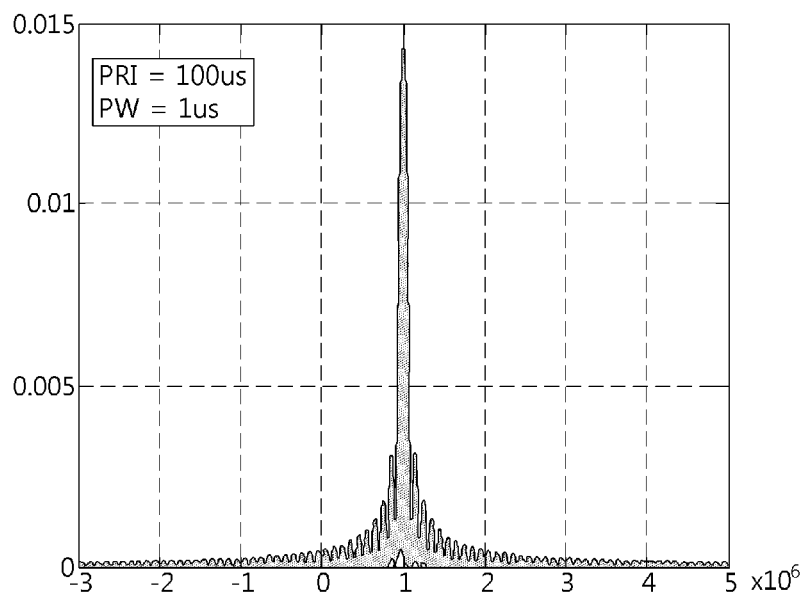
FIGS. 1A and 1B is a view showing the Fourier transform of a pulse-type signal.
Figure 1B:
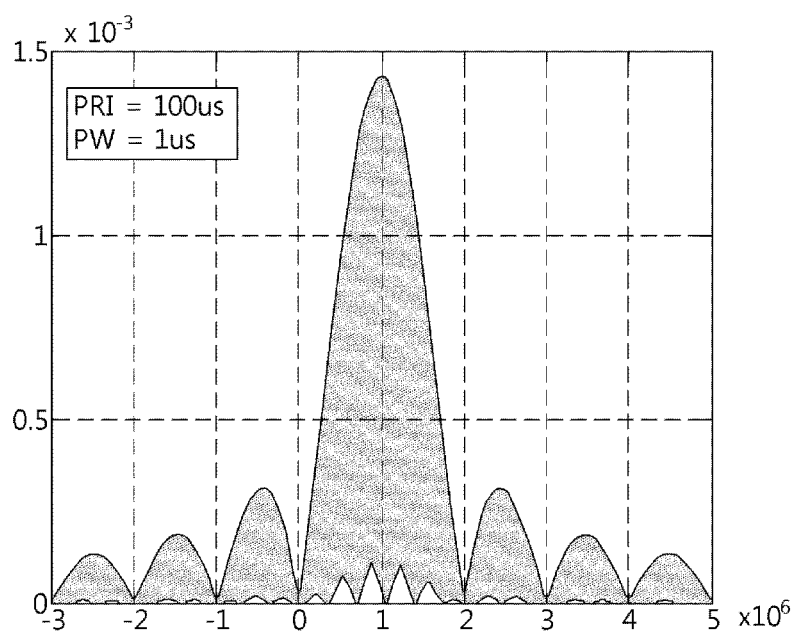
Figure 2:
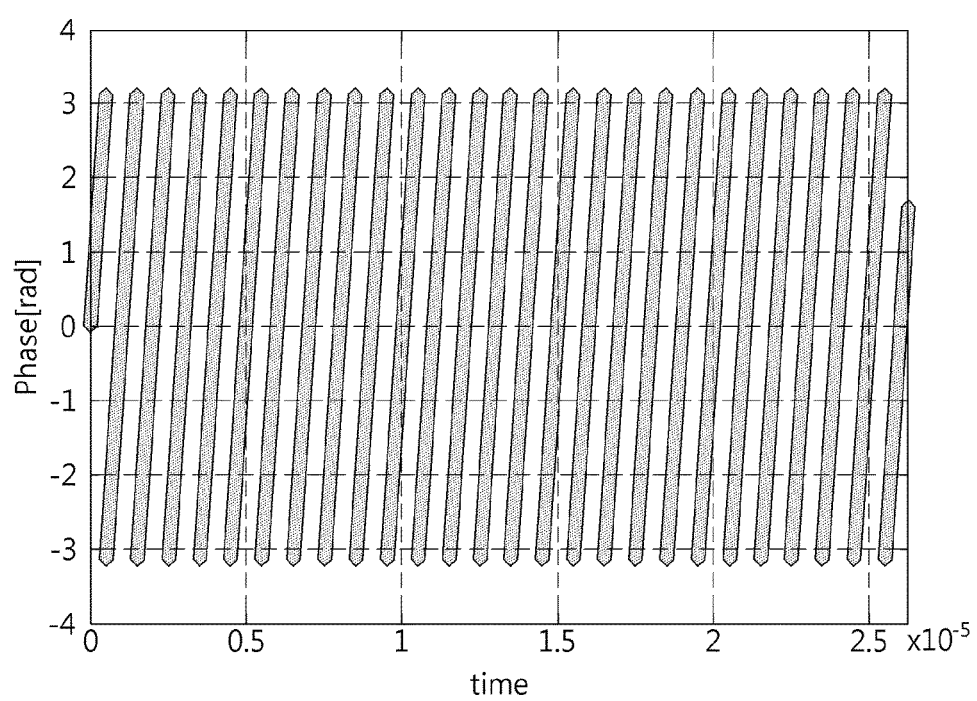
FIG. 2 is a view showing a measurement phase of a reception signal according to an acquisition time.
Figure 3:
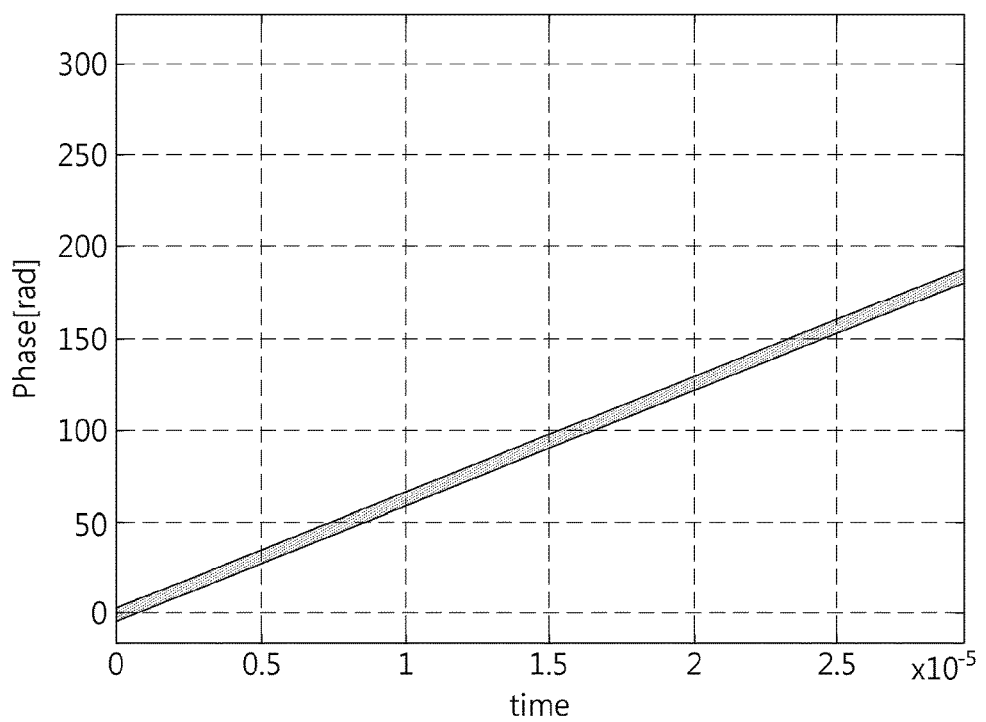
FIG. 3 is a view showing the result of unwrapping the reception signal of FIG. 2.
Figure 4:
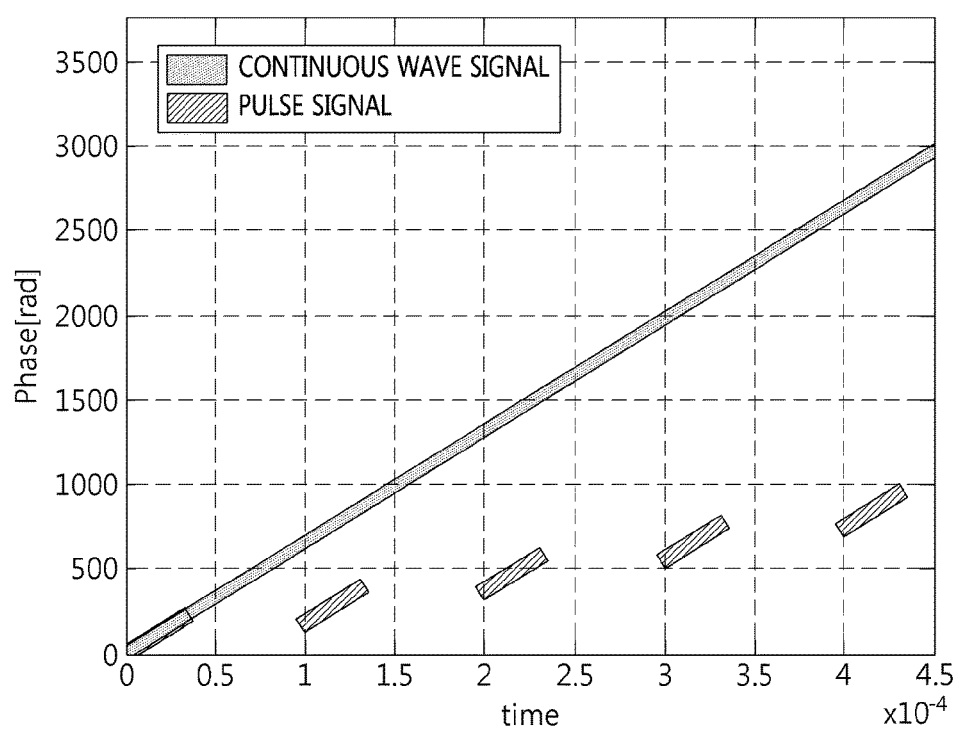
FIG. 4 is a view showing a comparison between unwrapping results of a continuous wave signal and a pulse signal.

The present invention will be described in detail below with reference to the accompanying drawings. It should be understood that the embodiment of the present invention may be changed to a variety of embodiments and the scope and spirit of the present invention are not limited to the embodiment described hereinbelow. The embodiment of the present invention described hereinbelow is provided for allowing those skilled in the art to more clearly comprehend the present invention, Therefore, it should be understood that the shape and size of the elements shown in the drawings may be exaggeratedly drawn to provide an easily understood description of the structure of the present invention. The same reference numerals will be used throughout the drawings and the description to refer to the same or like elements or parts. In the following description, it is to be noted that, when the functions of conventional elements and the detailed description of elements related with the present invention may make the gist of the present invention unclear, a detailed description of those elements will be omitted.

Figure 5:
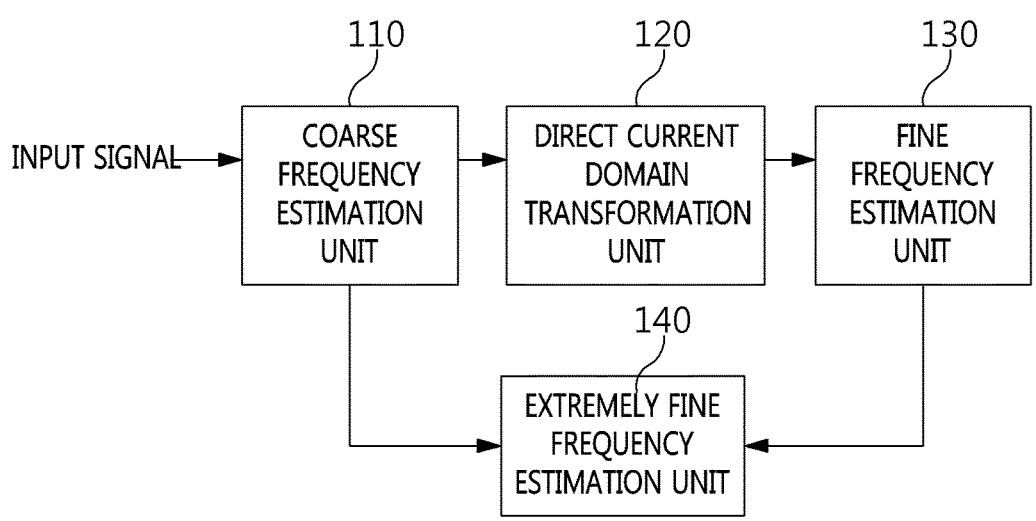
FIG. 5 is a view showing an extremely precise frequency estimation apparatus for a single receiver according to an embodiment of the present invention.
Figure 6:
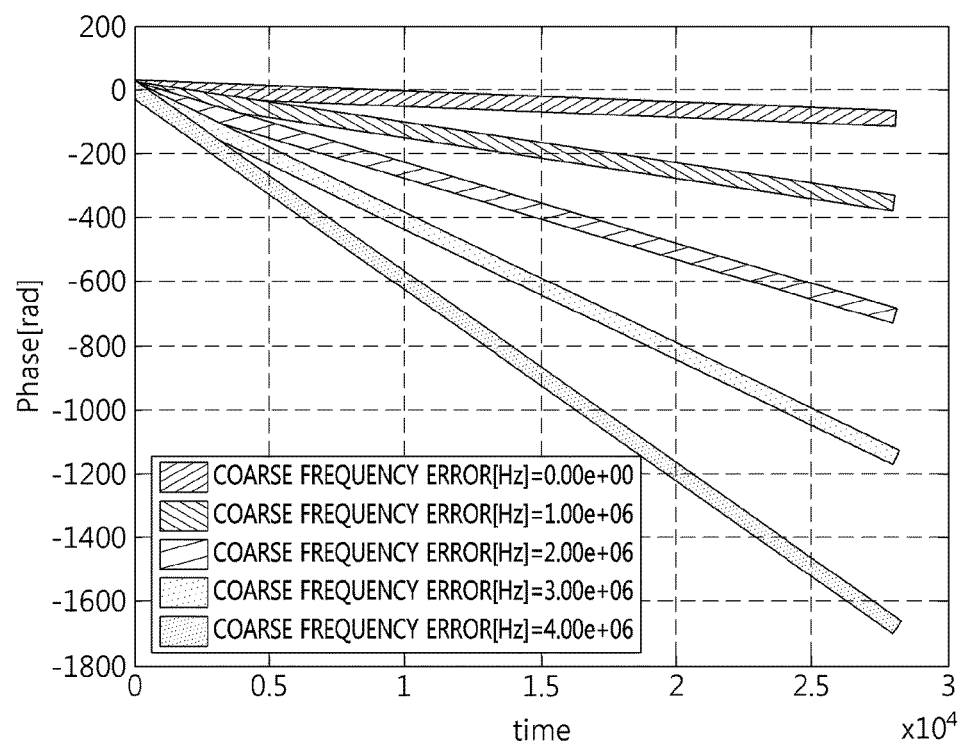
FIG. 6 is a view showing signal characteristics depending on an estimation error when a reception signal is transformed into a direct current domain region based on a coarse frequency.

FIG. 5 is a view showing an extremely precise frequency estimation apparatus for a single receiver according to an embodiment of the present invention, and FIG. 6 is a view showing signal characteristics depending on an estimation error when a reception signal is transformed into a direct current domain region based on a coarse frequency.

As shown in FIG. 5, according to the embodiment of the present invention, the extremely precise frequency estimation apparatus (hereinafter, referred to as a frequency estimation apparatus 100) of the single receiver may provide an extremely fine frequency estimation technique that reduces RMS error of scores Hz to several kHz, which occur with conventional frequency estimation techniques, to precisely estimate a frequency of a signal source in the single receiver, whereby it is possible to analyze and process the frequency.

To this end, a frequency estimation method having three steps is applied to the frequency estimation apparatus 100. That is, the first step is estimating a coarse frequency of a reception signal, and the second step is estimating a fine frequency of a signal transformed into a direct current domain of the coarse frequency, and the third step is estimating an extremely fine frequency by compensating the coarse frequency with the fine frequency.

In comparison with a conventional frequency estimation method, the frequency estimation apparatus 100 provides extremely fine frequency estimation accuracy. That is, the frequency estimation apparatus 100 has RMS error equal to or less than several Hz. In addition, the frequency estimation apparatus 100 provides a process that is faster and simpler than Fourier transform. Particularly, different from Fourier transform requiring an input value as an input variable for a section where a signal does not exist, the frequency estimation apparatus 100 requires an input value only for a section where a signal exists, and thus the frequency estimation apparatus requires reduced computation and memory requirements.

Specifically, the frequency estimation apparatus 100 includes a coarse frequency estimation unit 110, a direct current domain transformation unit 120, a fine frequency estimation unit 130, and an extremely fine frequency estimation unit 140. Here, it is desirable that the frequency estimation apparatus 100 is included in the single receiver.

First, the coarse frequency estimation unit 110 estimates a coarse frequency from pulse trains received during a predetermined time. Here, the coarse frequency may be a frequency where an error still exists without considering error correction.

The coarse frequency estimation unit 110 may estimate the coarse frequency as shown in formula 1.

$$CoarseFRQ = \frac{1}{N}\sum_{j=1}^{N} b_1^j \qquad \text{[formula 1]}$$

Here, the coarse frequency is designated as CoarseFRQ, the number of pulse trains is designated as N, a frequency estimation value by regression analysis on the j-th pulse is designated as $b_1^j$. Through formula 1, the coarse frequency of N pulse trains may be calculated from an average of frequency estimation values where regression analysis on each single pulse is used.

In the meantime, the frequency estimation value of each single pulse on which regression analysis is performed may be calculated through linear regression analysis such as formulas 2 and 3.

$$Y=XB \qquad \text{[formula 2]}$$

Here, a vector indicating a phase shift value of a pulse is designated as Y, a vector indicating an acquisition time of the pulse is designated as X, a vector indicating a parameter for inclination (slope) and intercept in linear regression analysis is designated as B meaning a frequency value (angle, degree) and an initial phase value.

Y is indicated as $Y=[y_1, y_2, \ldots, y_\omega]^T$, X is indicated as $X=[x_1, x_2, \ldots, x_\omega]^T$. B is indicated as $B=[b_1, b_2]^T$ that respectively means parameters for inclination and intercept in linear regression analysis. Accordingly, formula 2 may be indicated as formula 3.

$$\begin{bmatrix} y_1 \\ y_2 \\ y_3 \\ \vdots \\ \vdots \\ y_{\omega-2} \\ y_{\omega-1} \\ y_\omega \end{bmatrix} = \begin{bmatrix} x_1 & 1 \\ x_2 & 1 \\ x_3 & 1 \\ \vdots & \vdots \\ \vdots & \vdots \\ x_{\omega-2} & 1 \\ x_{\omega-1} & 1 \\ x_\omega & 1 \end{bmatrix} \begin{bmatrix} b_1 \\ b_2 \end{bmatrix} \qquad \text{[formula 3]}$$

Accordingly, B may be calculated by using linear algebra as shown in formula 4.

$$B=(X^TX)^{-1}X^TY \qquad \text{[formula 4]}$$

Here, a transform matrix for the vector X is designated as $X^T$, and an inverse matrix for the vector X is designated as $X^{-1}$. In $B=[b_1, b_2]^T$ calculated through formula 4, $b_1$ is a frequency estimation value of each single pulse.

Next, the direct current domain transformation unit 120 transforms the reception signal into a direct current domain region based on the coarse frequency. This is indicated as shown in formula 5.

$$DC\_Sig=Sig \times e^{-j2\pi X \times CoarseFRQ} \qquad \text{[formula 5]}$$

Here, a signal transformed into the direct current domain region is designated as DC_Sig, and an actual reception signal is designated as Sig. In addition, an acquisition time is designated as X.

When a coarse frequency and an original frequency of an original signal are the same without error, inclination of the signal transformed into the direct current domain region based on the coarse frequency has a value close to zero. That is, in an ideal case without noise, the inclination converges on zero. In contrast, when the error is large, the inclination of the signal is large. FIG. 6 shows such characteristics. Here, the coarse frequency error means an error between the coarse frequency and the original frequency. As described above, the error between the coarse frequency and the reception signal frequency has a negative or positive correlation with the inclination of the signal transformed into the direct current domain based on the coarse frequency.

Next, the fine frequency estimation unit 130 estimates a fine frequency of the signal transformed by the direct current domain transformation unit 120. This may be indicated as shown in formula 6.

$$y^{1\sim N}=X^{1\sim N}B \qquad \text{[formula 6]}$$

Here, a vector indicating phase shift values of the first pulse to the n-th pulse is designated as $y^{1\sim N}$, and a vector indicating an acquisition time of the first pulse to the n-the pulse is designated as $X^{1\sim N}$, namely, $y^{1\sim N}=[y_1^1, y_2^1, \ldots, y_{\omega_1}^1, y_1^2, y_2^2, \ldots, y_{\omega_2}^2, \ldots y_1^N, y_2^N, \ldots, y_{\omega_N}^N]^T$ and $X^{1\sim N}=[x_1^1, x_2^1, \ldots, x_{\omega_1}^1, x_1^2, x_2^2, \ldots, x_{\omega_2}^2, \ldots x_1^N, x_2^N, \ldots, x_{\omega_N}^N]^T$.

As described above, B is indicated as $B=[b_1, b_2]^T$. In $B=[b_1, b_2]^T$, $b_1$ and $b_2$ are vectors respectively indicating parameters for inclination and intercept in linear regression analysis, namely, a frequency value and an initial phase value.

Accordingly, $B=[b_1, b_2]^T$ may be calculated through formula 4. Here, $b_1$ is a fine frequency value estimated in the direct current domain of the coarse frequency. Here, FineFRQ is a fine frequency estimated in the direct current domain, and may be indicated as shown in formula 7.

$$FineFRQ=b_1 \qquad \text{[formula 7]}$$

Finally, the extremely fine frequency estimation unit 140 estimates an extremely fine frequency. This is indicated as shown in formula 8.

$$ExtFineFRQ=FineFRQ+CoarseFRQ \qquad \text{[formula 8]}$$

Here, ExtFineFRQ means an extremely fine frequency, FineFRQ means a fine frequency, and CoarseFRQ means a coarse frequency. The extremely fine frequency estimation unit 140 estimates an extremely fine frequency by adding the coarse frequency and the fine frequency. The extremely fine frequency is finally estimated as shown in formula 7 by compensating the error of the roughly measured coarse frequency with the fine frequency precisely estimated in the direct current domain.

Although the embodiment of the present invention have been disclosed for illustrative purposes, those skilled in the art will appreciate that various modifications, additions and substitutions are possible, without departing from the scope and spirit of the invention as disclosed in the accompanying claims. It is thus well known to those skilled in that art that the present invention is not limited to the embodiment disclosed in the detailed description, and the patent right of the present invention should be defined by the scope and spirit of the invention as disclosed in the accompanying claims. Accordingly, it should be understood that the present invention includes various modifications, additions and substitutions without departing from the scope and spirit of the invention as disclosed in the accompanying claims.

What is claimed is:

1. An extremely fine frequency estimation apparatus for a single receiver, the apparatus comprising:
    a coarse frequency estimation unit estimating a coarse frequency by calculating an average of frequency estimation values for each single pulse;
    a direct current domain transformation unit transforming a reception signal into a direct current domain based on the coarse frequency;
    a fine frequency estimation unit estimating a fine frequency by applying regression analysis to a pulse train in the direct current domain of the coarse frequency; and
    an extremely fine frequency estimation unit estimating an extremely fine frequency by compensating an error of the coarse frequency with the fine frequency.

2. The apparatus of claim 1, wherein the frequency estimation value of each single pulse is an inclination in linear regression analysis where vectors indicating a phase shift value and an acquisition time of the pulse are used.

3. The apparatus of claim 1, wherein the fine frequency is an inclination in linear regression analysis where vectors indicating a phase shift value and an acquisition time of the pulse train are used.

4. The apparatus of claim 1, wherein a frequency error between the coarse frequency and the reception signal has a negative or positive correlation with an inclination of a pulse train signal transformed into the direct current domain based on the coarse frequency.

5. The apparatus of claim 1, wherein the extremely fine frequency estimation unit estimates the extremely fine frequency by adding the coarse frequency and the fine frequency.

6. The apparatus of claim 2, wherein the inclination is a frequency value indicated as an angle.

7. An extremely fine frequency estimation method for a single receiver, the method comprising:
    estimating a coarse frequency by calculating an average of frequency estimation values for each single pulse;
    transforming a reception signal into a direct current domain based on the coarse frequency;
    estimating a fine frequency by applying regression analysis to a pulse train in the direct current domain of the coarse frequency; and
    estimating an extremely fine frequency by compensating an error of the coarse frequency with the fine frequency.

8. The method of claim 7, wherein the frequency estimation value of each single pulse is an inclination in linear regression analysis where vectors indicating a phase shift value and an acquisition time of the pulse are used.

9. The method of claim 7, wherein the fine frequency is an inclination in linear regression analysis where vectors indicating a phase shift value and an acquisition time of the pulse train are used.

10. The method of claim 7, wherein a frequency error between the coarse frequency and the reception signal has a negative or positive correlation with an inclination of the signal transformed into the direct current domain based on the coarse frequency.

11. The method of claim 8, wherein the inclination is a frequency value indicated as an angle.

* * * * *